(12) United States Patent
Mittel

(10) Patent No.: US 6,839,387 B1
(45) Date of Patent: Jan. 4, 2005

(54) SELF-DITHERING SIGMA-DELTA CONVERTER AND COMMUNICATION DEVICE INCORPORATING SAME

(75) Inventor: James Gregory Mittel, Lake Worth, FL (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/517,113

(22) Filed: Mar. 7, 2000

(51) Int. Cl.$^7$ .......................... H04B 14/06; H03M 3/00
(52) U.S. Cl. .................. 375/247; 375/316; 341/143
(58) Field of Search ................. 375/247, 245, 375/219, 316; 341/126, 144, 155, 143, 77; 395/242

(56) References Cited

U.S. PATENT DOCUMENTS 5,471,209 A * 11/1995 Sutterlin et al. ............ 375/245
5,768,315 A    6/1998 Mittel et al.
6,069,722 A * 5/2000 Schlag ....................... 398/183

* cited by examiner

Primary Examiner—Tesfaldet Bocure
(74) Attorney, Agent, or Firm—Hisashi D. Watanabe

(57) ABSTRACT

A sigma-delta converter operates over a predetermined bandwidth and includes a feedback loop comprising a forward path and a feedback path. The forward path includes, in series, a summer, a filter, and a comparator. The comparator produces an output signal that is fed back to a negative input of the summer via the feedback path. The sigma-delta converter also includes at least one instability generator positioned in the forward path and/or the feedback path. The instability generator generates one or more out-of-band instabilities in the feedback loop to substantially improve the in-band signal-to-noise performance of the converter for input signal amplitudes near a low end of the converter's dynamic range. The converter may be employed as an A/D converter, a D/D converter, or a D/A converter in a receiver and/or a transmitter of a wireless communication device.

11 Claims, 9 Drawing Sheets

SELF-DITHERING SIGMA-DELTA CONVERTER AND COMMUNICATION DEVICE INCORPORATING SAME

FIELD OF THE INVENTION

The present invention relates generally to sigma-delta converters and, more particularly, to a sigma-delta converter that has improved signal-to-noise performance for low-level input signals without utilizing an external dither signal.

BACKGROUND OF THE INVENTION

Wireless communication systems are well known and include various types of systems, such as cellular telephone systems, paging systems, two-way radio systems, personal communication systems, personal area networks, data systems, and various combinations thereof. Such wireless systems are known to include a system infrastructure and communication devices constructed and programmed to operate in the particular system. The system infrastructure includes fixed network equipment, such as base transceiver sites (BTSs), system controllers, switches, routers, communication links, antenna towers, and various other known infrastructure components. The communication devices include, inter alia, antenna systems, transmitters, receivers, processors, memory, user interfaces, and user controls.

In digital wireless communication systems, certain elements of the system, such as BTS or communication device receivers and/or BTS or communication device transmitters, typically include analog-to-digital (A/D) converters, digital-to-analog (D/A) converters, and/or digital-to-digital (D/D) converters depending upon the selected implementation of the system and its elements. Many such converters employ a sigma-delta architecture and are generally referred to as sigma-delta converters. Analog-to-digital converters of the sigma-delta architecture typically provide a coarse quantization analog-to-digital conversion of an input signal, resulting in a single bit output during each clock cycle. One such prior art sigma-delta converter 100 is depicted in electrical block diagram form in FIG. 1.

The sigma-delta converter 100 includes one or more feedback loops, each comprising a forward path and a feedback path. Each forward path includes one or more sets of serially connected summers 101, 102 and filters 104, 105, a comparator 107, and a storage device 109 docked typically at four Megahertz (4 MHz). The number of feedback loops (two shown) is equivalent to the number of summers 101, 102 and defines the order of the converter 100. The converter 100 of FIG. 1 is a second order sigma-delta converter.

The summers 101, 102 comprise conventional analog summers, the filters 104, 105 comprise conventional integrators, the comparator 107 comprises a conventional analog comparator, and the storage device 109 comprises one or more D flip-flops depending on the desired transfer function of the converter 100. For a lowpass converter, the storage device 109 typically comprises a single D flip-flop. For a bandpass converter, the storage device 109 typically comprises two cascaded D flip-flops 801, 802 in the arrangement depicted in FIG. 8. The filters 104, 105 reduce the quantization noise in the desired operating frequency band of the converter 100. For a typical lowpass converter 100, the filters 104, 105 reduce noise within a bandwidth of about 0–10 kilohertz (kHz).

Operation of the sigma-delta converter 100 occurs substantially as follows. An input signal source, such as a demodulator, provides an input signal 111 to summer 101. Summer 101 subtracts the input signal 111 from the clocked output signal 127 of the storage device 109 to produce error signal 113. Error signal 113 is averaged by filter 104 and averaged error signal 115 is applied to summer 102. Summer 102 subtracts averaged error signal 115 from the clocked output signal 127 of the storage device 109 to produce error signal 117. Error signal 117 is averaged by filter 105 and averaged error signal 119 is applied to the positive input of the comparator 107.

The comparator 107 compares averaged error signal 119 to a predetermined reference level 121 (e.g., signal ground) and produces a comparison result signal 123 based on the comparison. The comparison result signal 123 is applied to the storage device 109, where it is stored for a delay period (e.g., a clock cycle) and output responsive to a dock signal 125. The clocked output signal 127 of the storage device 109 forms the single bit output of the sigma-delta converter 100 and is typically applied to a signal processor. The negative feedback loops of the converter 100 force the average of the single bit output 127 of the converter 100 to accurately represent the input 111 despite the coarseness of the instantaneous approximation.

For large input signals 111, such as those greater than or equal to about one-half the full scale voltage level that can be accepted by the converter 100 without introducing non-linear distortion, the converter 100 of FIG. 1 functions very well as illustrated in FIGS. 2 and 3. FIGS. 2 and 3 are broadband and narrowband spectral diagrams 200, 300, respectively, of the amplitude of a Fast Fourier Transform (FFT) performed on the output signal 127 of the converter 100 for a 10 kHz, relatively large amplitude (e.g., one-half full scale) input signal 111. As depicted in FIG. 2, the average broadband noise of the converter 100 remains relatively flat at −60 decibels above one volt (dBV) and, as depicted in FIG. 3, the average in-band noise (i.e., the noise in the range of 0–10 kHz) is more than 110 dB below the input signal level.

Although the sigma-delta converter 100 of FIG. 1 performs well for large-scale input signals 111, it performs poorly for input signals 111 near the low end of the converter's dynamic range (e.g., approximately one one-hundredth or less of the full scale voltage level that can be accepted by the converter 100). Such low-level input signals 111 can generate repeating output bit patterns that create in-band idle tones in the converter's output signal 127. The presence of in-band idle tones is illustrated in FIGS. 4 and 5. FIGS. 4 and 5 are broadband and narrowband spectral diagrams 400, 500, respectively, of the amplitude of an FFT performed on the output signal 127 of the converter 100 for a 10 kHz, relatively small amplitude (e.g., $\frac{1}{500}^{th}$ full scale) input signal 111. As depicted in FIG. 4, the average broadband noise of the converter 100 still remains relatively flat at −50 dBV. However, as depicted in FIG. 5, idle tones 501 at integer multiples of 2 kHz significantly degrade the signal-to-noise performance of the converter 100. Such tones may cause the automatic frequency control (AFC) system of a communications receiver to falsely lock on an idle tone 501 instead of the desired signal.

To substantially reduce the levels of the idle tones 501, conventional communications devices employ a dither signal generator 129 to generate an out-of-band dither signal 131 with which to continuously drive the sigma-delta converter 100. The dither signal generator 129 may be an out-of-band tone generator or a complicated circuit that generates pseudo-random noise sequences. The dither signal amplitude is typically sufficient to keep the converter 100 operating under large signal conditions, regardless of the input signal level of the desired in-band signal 111. By maintaining large signal converter operation, the dither signal 131 reduces the in-band idle tones as illustrated in FIGS. 6 and 7.

FIGS. 6 and 7 are broadband and narrowband spectral diagrams 600, 700, respectively, of the amplitude of an FFT performed on the output signal 127 of the converter 100 for a 10 kHz, relatively small amplitude input signal 111 under the same conditions as in FIGS. 4 and 5, and a 125 kHz dither signal 131 of substantially larger amplitude than the amplitude of the input signal 111. With respect to the graphs 600, 700 of FIGS. 6 and 7, the dither signal amplitude is approximately $\frac{1}{12}$ the full scale amplitude that can be accepted by the converter 100 without introducing nonlinear distortion. As depicted in FIG. 6, FFT amplitude peaks are evident at integer multiples of the dither signal frequency (i.e., 125 kHz). The amplitude peaks indicate the presence of the dither signal 131 in the converter output 127. As shown in FIG. 7, the dither signal 131 functions to reduce the amplitudes of the idle tones 701 for low-level input signals 111 as compared to the amplitudes of the idle tones 501 without use of such a dither signal 131 as in FIG. 5. A comparison of FIG. 7 to FIG. 5 (both of which were generated under the same input conditions) shows that the addition of the dither signal 131 reduces the in-band idle tone signal level by approximately 17 dB (i.e., from about 43 dB below the input signal level of −60 dBV to about 60 dB below the input signal level).

However, the idle tone amplitude reduction provided by the externally-applied dither signal 131 does not occur without a cost. The addition of the dither signal 131 can cause a spurious response signal in a radio frequency (RF) operating band of a communication device when the converter 100 and the dither signal generator 129 are incorporated into a receiver or transmitter of such a device. The dither signal 131 can heterodyne or mix with RF signals of the communication system in which the communication device operates to produce an in-band RF product. Such an in-band RF product can compromise the spurious response specification of the communication device. Increasing the frequency of the dither signal 131 (e.g., to 1 MHz) typically reduces the influence of the RF spurious signal by effectively moving the spurious signal out of the RF operating band of the communication device. However, such an increase in dither signal frequency also reduces the effectiveness of the dither signal 131 in reducing the levels of the idle tones 501, 701 because, at higher frequencies, the dither signal 131 becomes less distinguishable from the elevating noise floor.

Therefore, a need exists for a sigma-delta converter that provides improved in-band signal-to-noise performance for low-level input signals without requiring the use of an external dither signal. There is a further need for a communication device that incorporates such a sigma-delta converter to perform A/D, D/D, and/or D/A conversion without degrading spurious response performance of the device.

DETAILED DESCRIPTION OF A PREFERRED EMBODIMENT

Generally, the present invention encompasses a self-dithering sigma-delta converter and a communication device incorporating such a converter. The sigma-delta converter operates over a predetermined bandwidth (e.g., 0–10 kHz) and includes a feedback loop comprising a forward path and a feedback path. The forward path includes, in series, a summer, a filter, and a comparator. The comparator produces an output signal that is fed back to a negative input of the summer via the feedback path. The sigma-delta converter also includes at least one instability generator positioned in at least one of the forward path and the feedback path. The instability generator generates one or more out-of-band instabilities in the feedback loop (i.e., instabilities at one or more frequencies outside the operating bandwidth of the converter) to substantially improve the in-band signal-to-noise performance of the converter for relatively small amplitude input signals (e.g., input signal amplitudes near a low end of the converter's dynamic range). The converter may be employed as an A/D converter, a D/D converter, or a D/A converter in a receiver and/or a transmitter of a wireless communication device.

By constructing the sigma-delta converter to include an instability generator in this manner, the present invention enables the sigma-delta converter itself to correlate in-band idle tone and quantization noise energy at out-of-band frequencies to improve in-band signal-to-noise performance of the converter. Therefore, unlike prior art converters that utilize externally applied dither signals to drive the converter hard enough to reduce in-band quantization noise and idle tones, the present invention eliminates the need for such external signals by including an instability generator directly in the converter's feedback loop. Moreover, in contrast to prior art dither-signal driven converters, the present invention improves the converter's in-band signal-to-noise performance without creating spurious RF signals that can degrade the spurious response performance of a communication device incorporating the converter.

Figure 1:
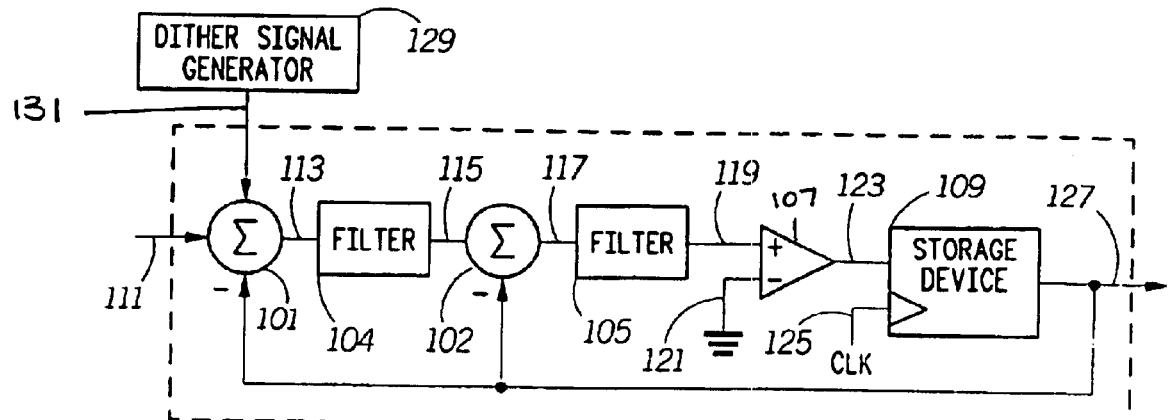
FIG. 1 is an electrical block diagram of a prior art sigma-delta converter being driven by an external dither signal to improve the signal-to-noise performance of the converter.
Figure 8:
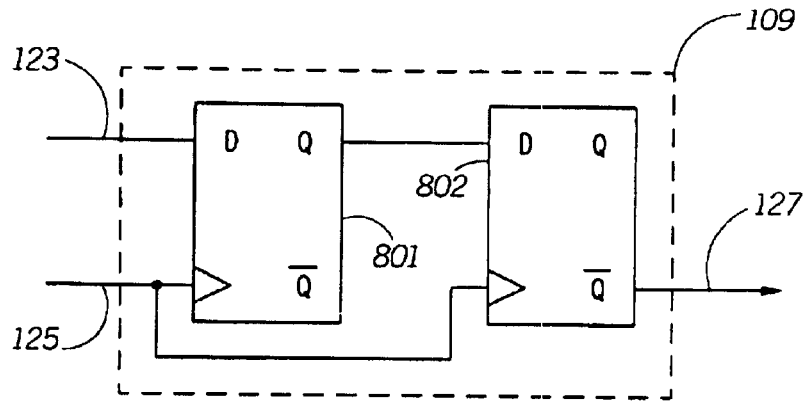
FIG. 8 is a prior art implementation of the storage device present in the sigma-delta converter of FIG. 1 to facilitate bandpass operation of the sigma-delta converter.
Figure 9:
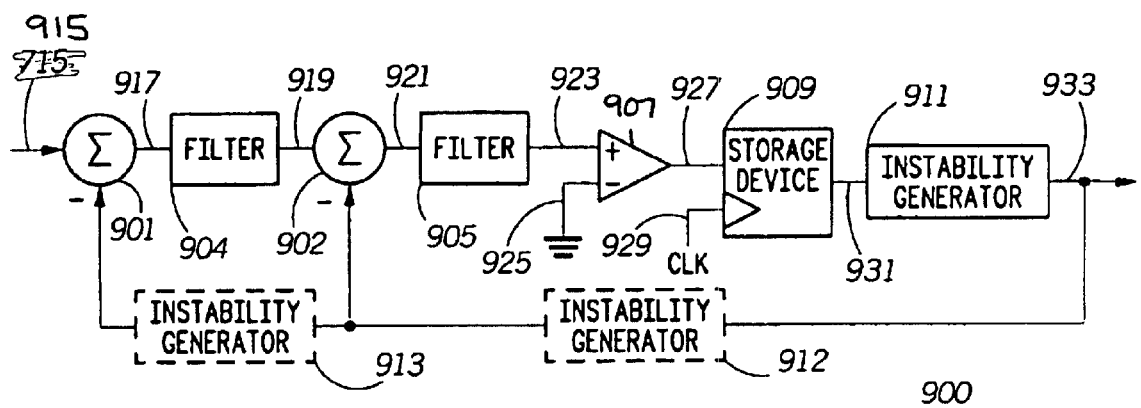
FIG. 9 is an electrical block diagram of a sigma-delta converter that includes at least one instability generator to substantially reduce in-band idle tone amplitude and improve converter signal-to-noise performance in accordance with the present invention.

The present invention can be more fully understood with reference to FIGS. 9–20, in which like reference numerals designate like items. FIG. 9 illustrates an electrical block diagram of a sigma-delta converter 900 in accordance with the present invention. Similar to the prior art sigma-delta converter 100 of FIG. 1, the sigma-delta converter 900 includes one or more feedback loops, each comprising a forward path and a feedback path. As in the prior art converter 100, each forward path includes one or more sets of serially connected summers 901, 902 and filters 904, 905, a comparator 907, and a clocked storage device 909. As also in the prior art converter 100, the number of feedback loops (two shown) is preferably equivalent to the number of summers 901, 902. However, in contrast to the prior art converter 100, the converter 900 of the present invention includes one or more instability generators 911–913 positioned in the forward path and/or the feedback path of one or more of the feedback loops. In the preferred embodiment, the converter 900 includes a single instability generator 911 coupled to the output of the storage device 909 and located in the forward paths of the feedback loops. In alternative embodiments, an additional instability generator(s) 912, 913 may be located in the feedback path(s), or the instability generator(s) 912, 913 may be located only in the feedback path(s). The instability generator 911 creates at least one feedback loop instability at a frequency outside the operating bandwidth of the converter 900 (i.e., out-of-band). The out-of-band instability correlates quantization noise energy normally within the converter's operating bandwidth (i.e., in-band noise) at the frequency of the instability (i.e., out of band), thereby reducing the in-band noise and idle tone energy that can degrade the converter's signal-to-noise performance.

The summers 901, 902 preferably comprise conventional analog summers, the filters 904, 905 preferably comprise conventional integrators and may include storage and/or delay elements, the comparator 907 preferably comprises a conventional analog comparator, and the storage device 909 preferably comprises a D flip-flop. The instability generator 911 is preferably positioned in the forward path of both feedback loops and preferably comprises one or more cascaded D flip-flops, each introducing a predetermined delay into the clocked output signal 931 of the storage device 909. In an alternative embodiment, the instability generator 911 may comprise a resistor connected in series with a capacitor (i.e., a series RC delay circuit); however, the D flip-flop implementation is preferred due to the more precisely controllable nature of a delay that is based on a clock cycle or a portion thereof. The introduction of delays in the feedback loop causes changes in feedback loop phase at out-of-band frequencies resulting in feedback loop instabilities at frequencies at which the loop phase is near zero degrees. Although depicted with two feedback loops and, accordingly two summers 901, 902 and filters 904, 905, the sigma-delta converter 900 may employ any number of feedback loops in accordance with known techniques. Unless otherwise stated herein, the following discussion is based on the second order, lowpass sigma-delta converter 900 depicted in FIG. 9, wherein the converter 900 includes only one instability generator 911 and has an operating bandwidth of 0–10 kHz.

Operation of the sigma-delta converter 900 occurs substantially as follows in accordance with the present invention. An input signal source (not shown), such as a demodulator, provides an input signal 915 to summer 901. Summer 901 subtracts the input signal 915 from the output signal 933 of the instability generator 911 to produce error signal 917. Error signal 917 is averaged by filter 904 and averaged error signal 919 is applied to summer 902. Summer 902 subtracts averaged error signal 919 from the output signal 933 of the instability generator 911 to produce error signal 921. Error signal 921 is averaged by filter 905 and averaged error signal 923 is applied to the positive input of the comparator 907.

The comparator 907 compares averaged error signal 923 to a predetermined reference level 925 (shown as signal ground) and produces a comparison result signal 927 based on the comparison. The comparison result signal 927 is applied to the storage device 909, where it is stored for a delay period (e.g., a clock cycle) and output responsive to a dock signal 929. In the preferred embodiment, the clock signal is a four Megahertz (4 MHz) square wave.

The clocked output signal 931 of the storage device 909 is applied to the instability generator 911, where it is stored for the predetermined delay period necessary to generate the desired out-of-band instability. The time-delayed representation 933 of the docked output signal 931 is then fed back to the negative inputs of the summers 901, 902 via the feedback paths (e.g., conductive printed circuit board traces).

When the sigma-delta converter 900 is used to implement an A/D converter, the output signal 933 of the converter 900 comprises a bit stream. A Fast Fourier Transform (FFT) of the bit stream output 933 of the converter 900 can be used to analyze the converter's performance for varying amplitude input signals. As discussed above, input signals 915 near the low end of the converter's dynamic range (e.g., approximately one one-hundredth or less of the full scale voltage level (e.g., 10 $V_{p-p}$ when a logical one is represented by +5 Volts and a logical zero is represented by −5 Volts) that can be accepted by the converter 900 without introducing nonlinear distortion) can generate repeating bit patterns that result in the creation of in-band idle tones in the converter's output signal 933. The inclusion of an instability generator 911 in accordance with the present invention serves to spectrally relocate the energy associated with the idle tones to out-of-band frequencies and, thereby, improve the in-band signal-to-noise performance of the converter for low level input signals 915.

Figure 10:
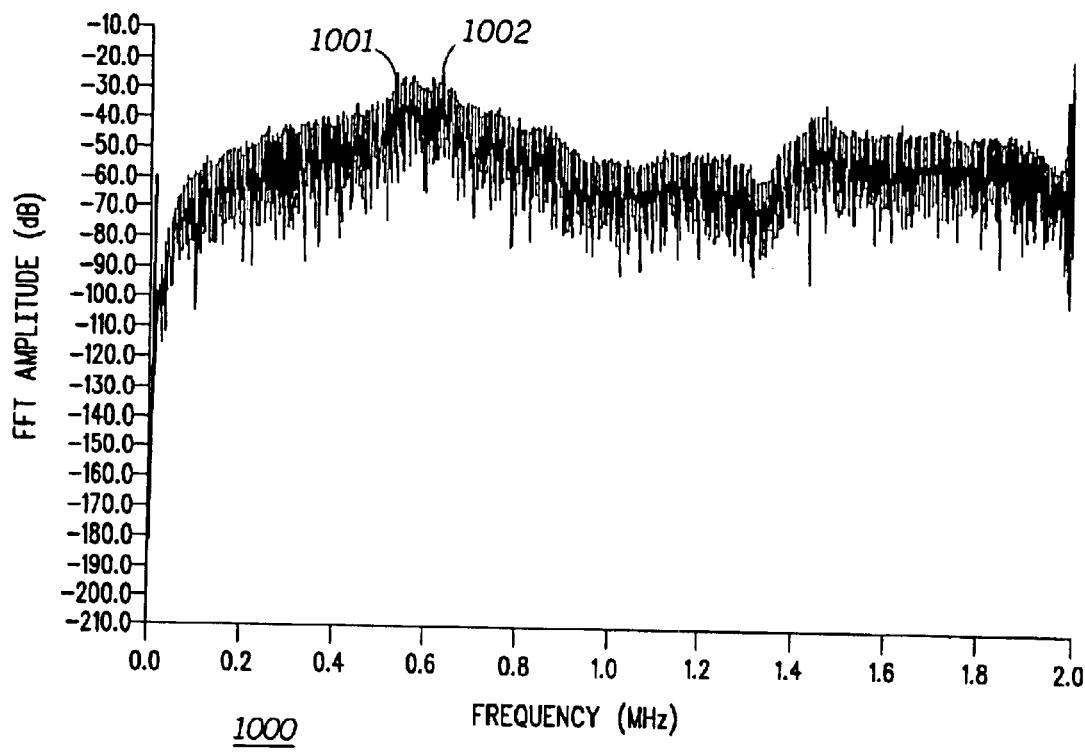
FIG. 10 is a broadband spectral diagram of the amplitude of an FFT performed on the output signal of the converter of FIG. 9 for a 10 kHz, relatively small amplitude input signal illustrating the presence of out-of-band instabilities generated by an instability generator having a single dock cycle delay.
Figure 11:
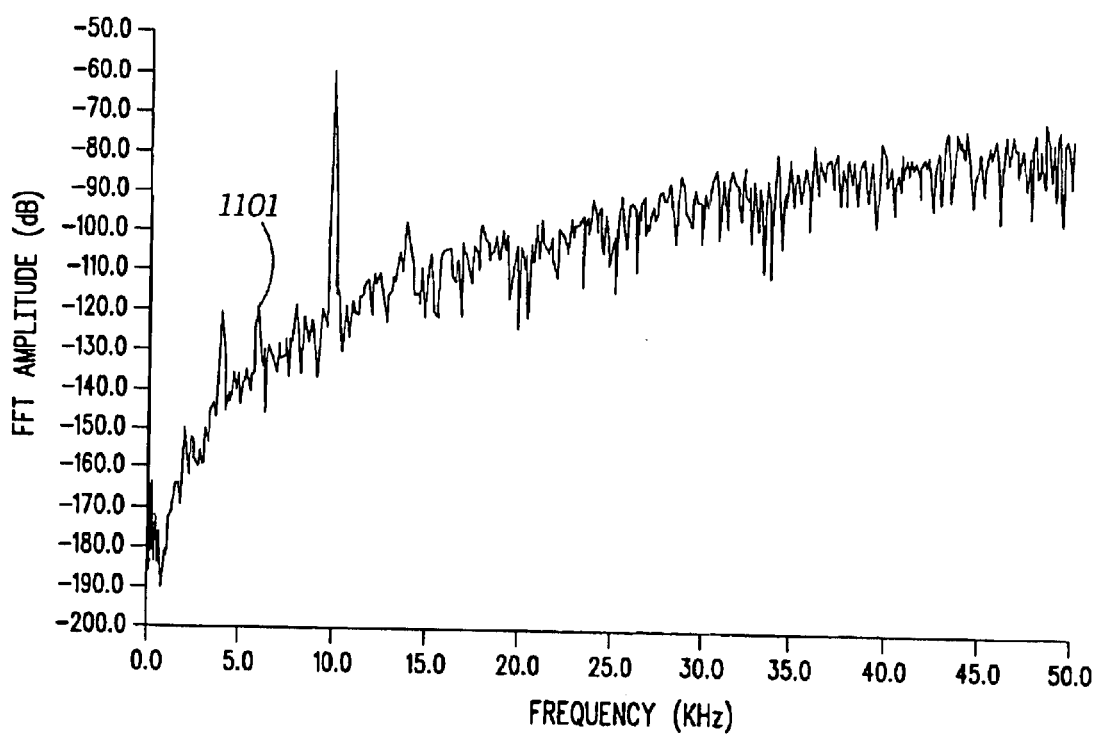
FIG. 11 is a narrowband spectral diagram of the amplitude of an FFT performed on the output signal of the converter of FIG. 9, under the same input conditions as for FIG. 10, depicting substantial reduction of in-band idle tone amplitude due to the presence of the out-of-band instabilities illustrated in FIG. 10.

FIGS. 10 and 11 are broadband and narrowband spectral diagrams 1000, 1100, respectively, of the amplitude of an FFT performed on the output signal 933 of the converter 900 for a 10 kHz, relatively small amplitude (e.g., $\frac{1}{500}^{th}$ full scale) input signal 915 illustrating the presence of out-of-band instabilities 1001, 1002 generated by the instability generator 911 and the resulting reduction in idle tone 1101 signal level. With respect to these diagrams 1000, 1100, the instability generator 911 comprises a single D flip-flop and introduces a single clock cycle delay (e.g., 250 nanoseconds (ns) for a 4 MHz clock signal 929 applied to both the storage device 909 and the instability generator 911) to the clocked output signal 931 of the storage device 909. As illustrated in FIG. 10, the single clock cycle delay introduced by the instability generator 911 causes feedback loop instabilities 1001, 1002 at approximately 550 kHz and 650 kHz, well outside the 0–10 kHz operating bandwidth of the converter 900. Moreover, a comparison of FIG. 11 to FIG. 5 (both of which were generated under the same input conditions) shows that the instabilities 1001, 1002 reduce the in-band idle tone signal level by approximately 17 dB (i.e., from about 43 dB below the input signal level of −60 dBV to about 60 dB below the input signal level).

Figure 12:
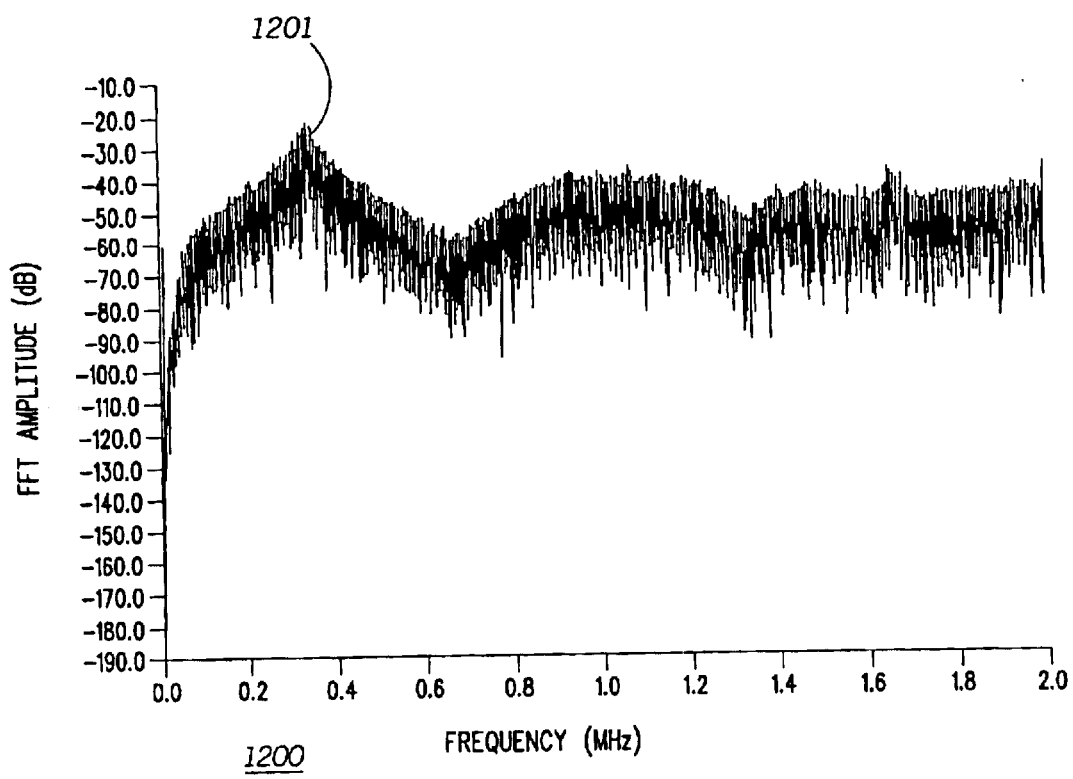
FIG. 12 is a broadband spectral diagram of the amplitude of an FFT performed on the output signal of the converter of FIG. 9 for a 10 kHz, relatively small amplitude input signal illustrating the presence of an out-of-band instability generated by an instability generator having a two dock cycle delay.
Figure 13:
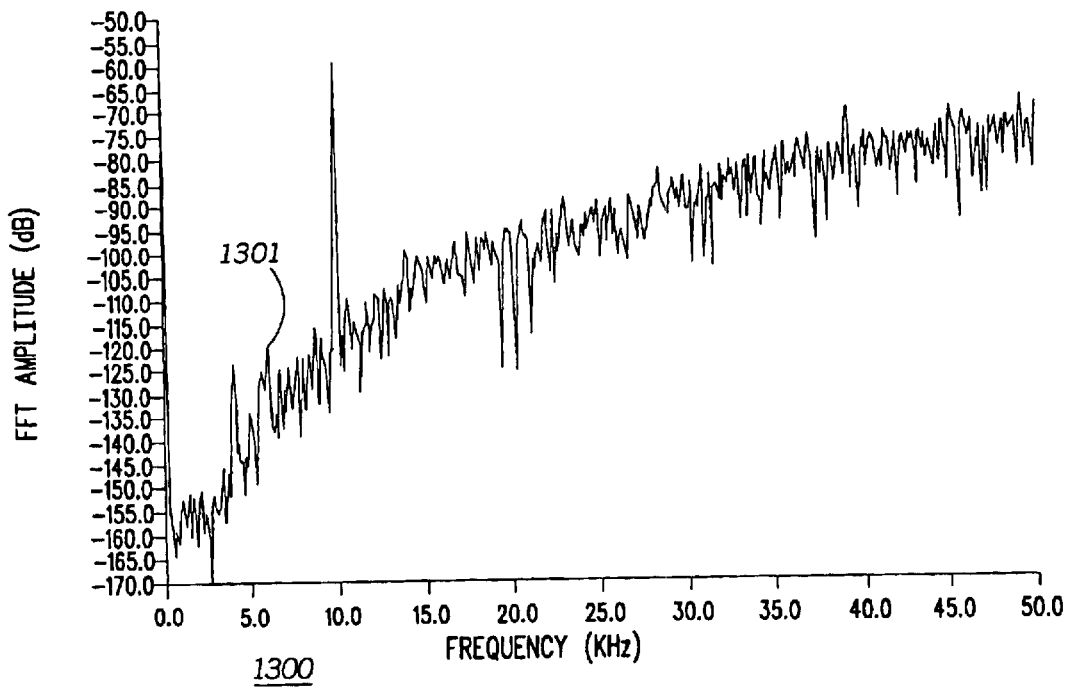
FIG. 13 is a narrowband spectral diagram of the amplitude of an FFT performed on the output signal of the converter of FIG. 9, under the same input conditions as for FIG. 12, depicting further reduction of in-band idle tone amplitude due to the presence of the out-of-band instability illustrated in FIG. 12.

Further reduction of in-band idle tone signal levels can generally be achieved by increasing the delay introduced by the instability generator 911. Such increased delay serves to reduce the frequency of the instability and further concentrate the noise energy at the instability frequency. FIGS. 12 and 13 illustrate this additional idle-tone level reduction.

Figure 5:
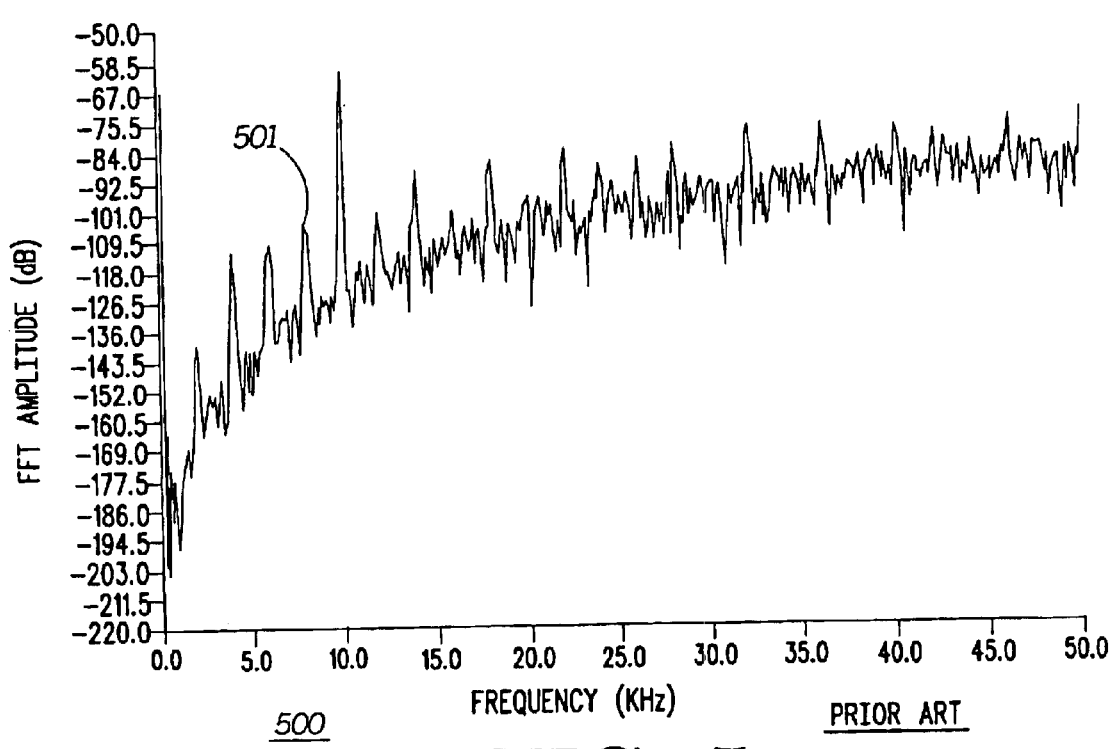
FIG. 5 is a narrowband spectral diagram of the amplitude of an FFT performed on the output signal of the converter of FIG. 1, under the same input conditions as for FIG. 4, depicting in-band idle tones that degrade signal-to-noise performance of the sigma-delta converter.
Figure 6:
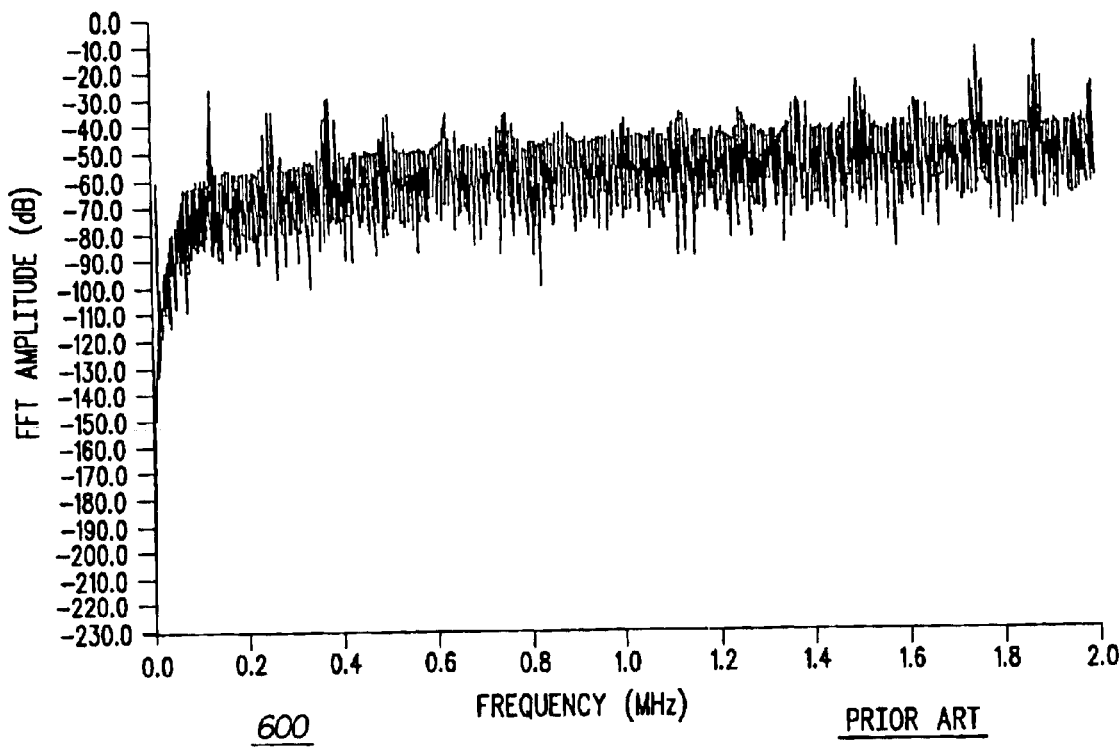
FIG. 6 is a broadband spectral diagram of the amplitude of an FFT performed on the output signal of the converter of FIG. 1 for a 10 kHz, relatively small amplitude input signal as in FIG. 4 and a 125 kHz dither signal of substantially larger amplitude than the 10 kHz input signal.
Figure 7:
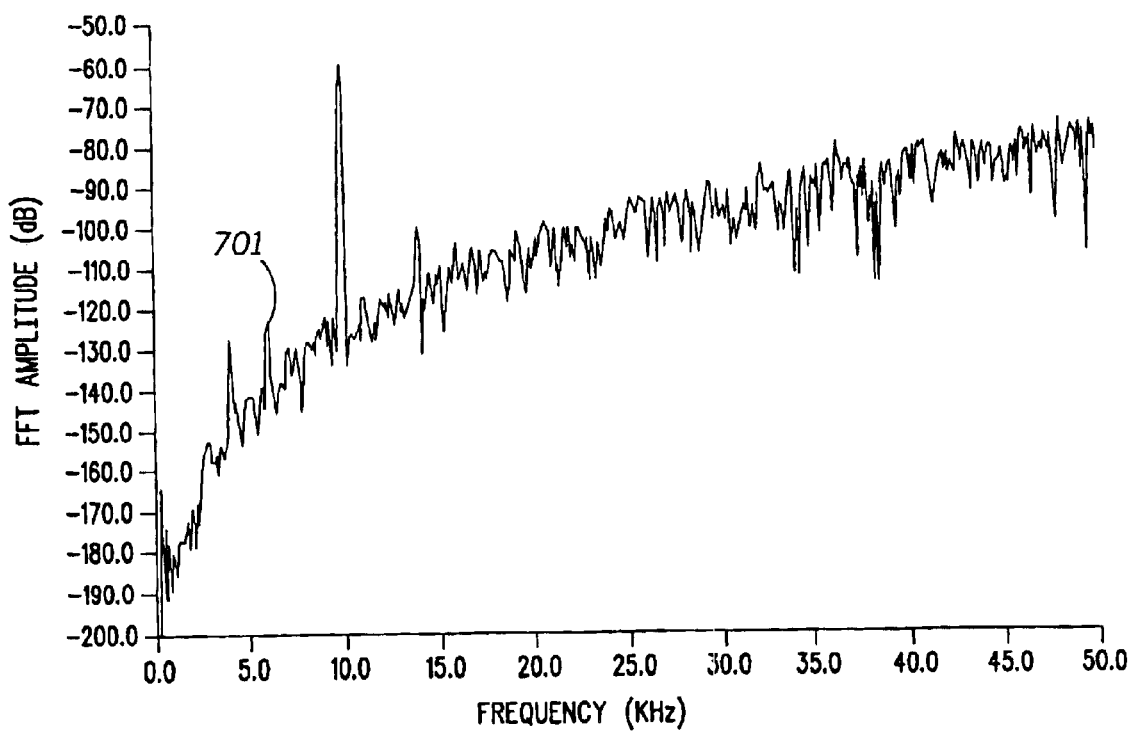
FIG. 7 is a narrowband spectral diagram of the amplitude of an FFT performed on the output signal of the converter of FIG. 1 under the same input conditions as for FIG. 6 depicting substantial reduction of in-band idle tone amplitude due to the presence of the dither signal.

FIGS. 12 and 13 are broadband and narrowband spectral diagrams 1200, 1300, respectively, of the amplitude of an FFT performed on the output signal 933 of the converter 900 for a 10 kHz input signal under the same input conditions as for FIGS. 4, 5, 10, and 11. With respect to these diagrams 1200, 1300, the instability generator 911 comprises two cascaded D flip-flops and introduces a two dock cycle delay (e.g., 500 ns for a 4 MHz dock signal 929) to the docked output signal 931 of the storage device 909. As illustrated in FIG. 12, the two dock cycle delay introduced by the instability generator 911 causes a feedback loop instability 1201 at approximately 300 kHz, still well outside the 0–10 kHz operating bandwidth of the converter 900. Moreover, a comparison of FIG. 13 to FIG. 5 shows that the instability 1201 reduces the in-band idle tone signal level by approximately 18 dB (i.e., from about 43 dB below the input signal level of −60 dBV to about 61 dB below the input signal level).

Figure 14:
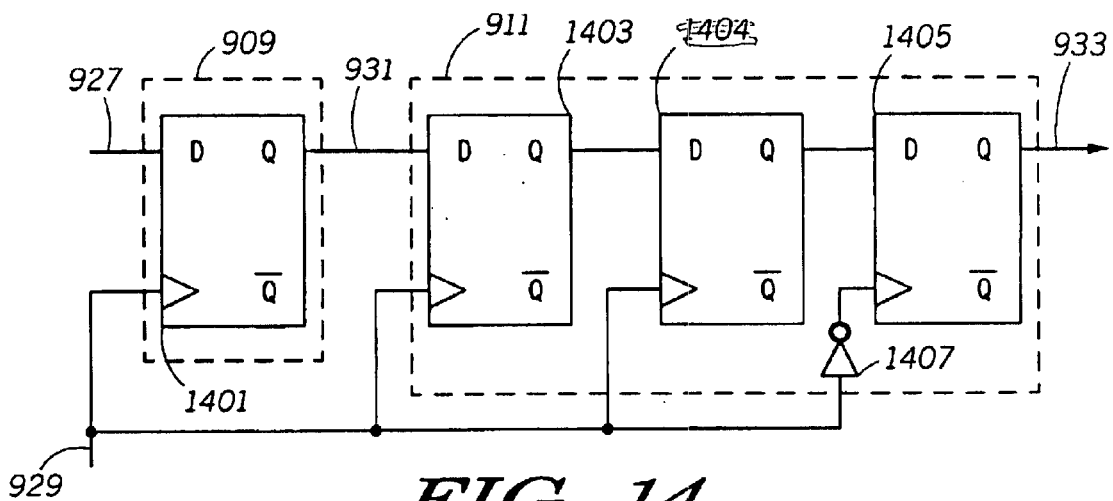
FIG. 14 is an electrical block diagram of preferred embodiments of the storage device and the instability generator forming part of the sigma-delta converter of FIG. 9.

In a preferred embodiment, the instability generator 911 introduces a one and one-half clock cycle delay (e.g., 325 ns for a 4 MHz clock signal 929) to the clocked output signal 931 of the storage device 909. A preferred implementation of an instability generator 911 that produces such a one and one-half cycle delay is depicted in electrical block diagram form in FIG. 14. As shown, the preferred instability generator 911 includes two D flip-flops 1403, 1405. One of the flip-flops 1403 is responsive to a first edge (e.g., the rising edge) of the dock signal 929 and the other flip-flop 1405 is responsive to a second edge (e.g., a falling edge) of the clock signal 929. To render flip-flop 1405 responsive to the falling edge of the clock signal 929, a conventional inverter 1407 is preferably inserted between the clock signal generator (not shown in FIG. 14) and the clock signal input of flip-flop 1405. The flip-flop 1403 responsive to the same edge of the clock signal 929 as is the storage device 909 introduces one clock cycle delay and the flip-flop 1405 responsive to the other edge of the clock signal 929 introduces the one-half clock cycle delay. Therefore, although a particular two D flip-flop arrangement for the instability generator 911 is depicted in FIG. 14, an alternative arrangement in which flip-flop 1405 is responsive to the same edge (e.g., rising or falling edge) of the clock signal 929 as is the storage device 909 and flip-flop 1403 is responsive to the other edge (e.g., falling or rising edge) of the dock signal 929 would also suffice to implement the preferred instability generator 911. FIG. 14 also depicts a preferred implementation of the storage device 909 as a D flip-flop 1401 responsive to the same edge of the dock signal 929 as is one of the two flip-flops 1403, 1405 that constitute the preferred instability generator 911.

Figure 15:
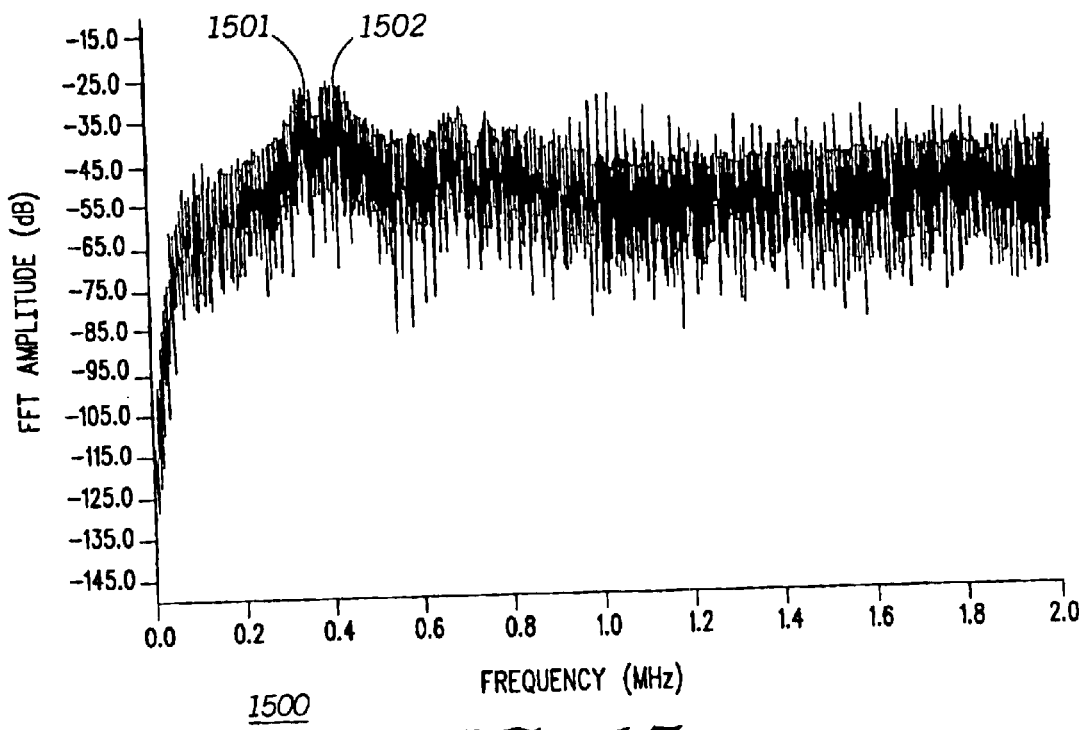
FIG. 15 is a broadband spectral diagram of the amplitude of an FFT performed on the output signal of the converter of FIG. 9 for a 10 kHz, relatively small amplitude input signal illustrating the presence of out-of-band instabilities generated by the preferred instability generator of FIG. 14.
Figure 16:
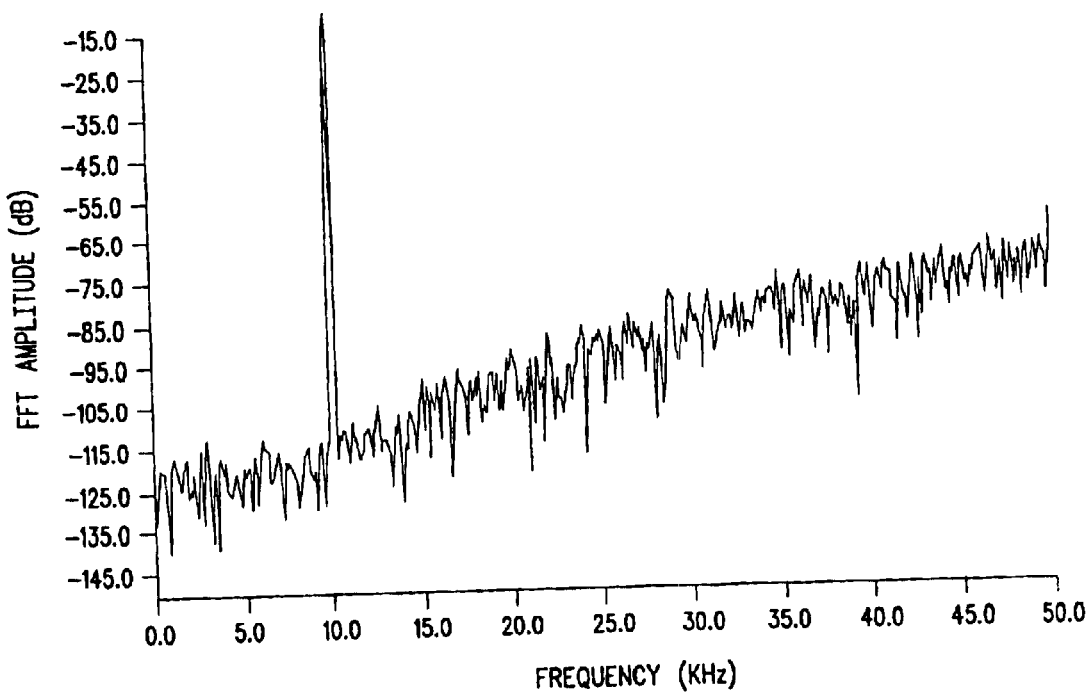
FIG. 16 is a narrowband spectral diagram of the amplitude of an FFT performed on the output signal of the converter of FIG. 9, under the same input conditions as for FIG. 15, depicting substantial reduction of in-band idle tone and noise amplitude due to the presence of the out-of-band instabilities generated by the preferred instability generator of FIG. 14.

FIGS. 15 and 16 illustrate the improvement of in-band idle tone signal level when the instability generator 911 comprises the preferred embodiment of FIG. 14. FIGS. 15 and 16 are broadband and narrowband spectral diagrams 1500, 1600, respectively, of the amplitude of an FFT performed on the output signal 933 of the converter 900 for a 10 kHz input signal under the same input conditions as for FIGS. 4, 5, 10, 11, 12, and 13 (i.e., input signal amplitude of approximately $\frac{1}{500}^{th}$ full scale and a clock signal 929 of 4 MHz). As shown in FIG. 15, the preferred instability generator 911 creates two out-of-band instabilities at frequencies of about 375 kHz and 425 kHz, well outside the operating bandwidth of the converter 900. Moreover, a comparison of FIG. 16 to FIG. 5 shows that the instabilities 1501, 1502 reduce the in-band idle tone signal level to a level that is below the average thermal noise level of the sigma-delta converter 900 (e.g., below −115 dBV for the operating conditions described above).

Figure 2:
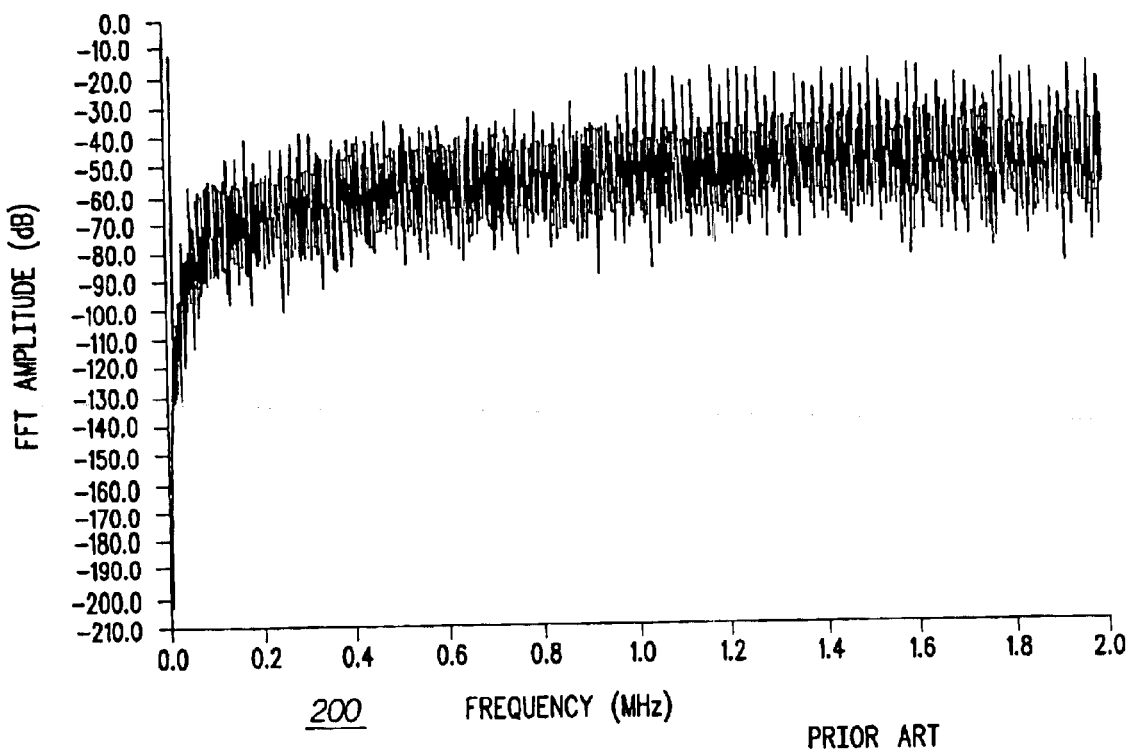
FIG. 2 is a broadband spectral diagram of the amplitude of an FFT performed on the output signal of the converter of FIG. 1 for a 10 kHz, relatively large amplitude input signal.
Figure 3:
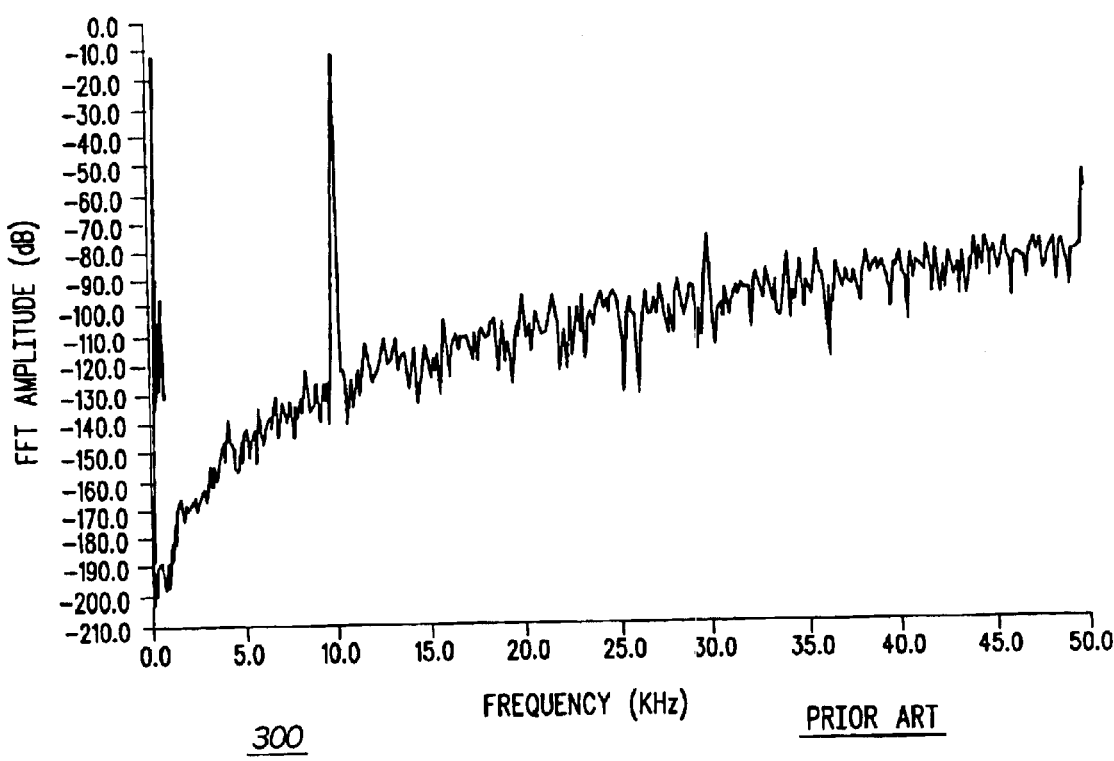
FIG. 3 is a narrowband spectral diagram of the amplitude of an FFT performed on the output signal of the converter of FIG. 1 under the same input conditions as for FIG. 2.
Figure 4:
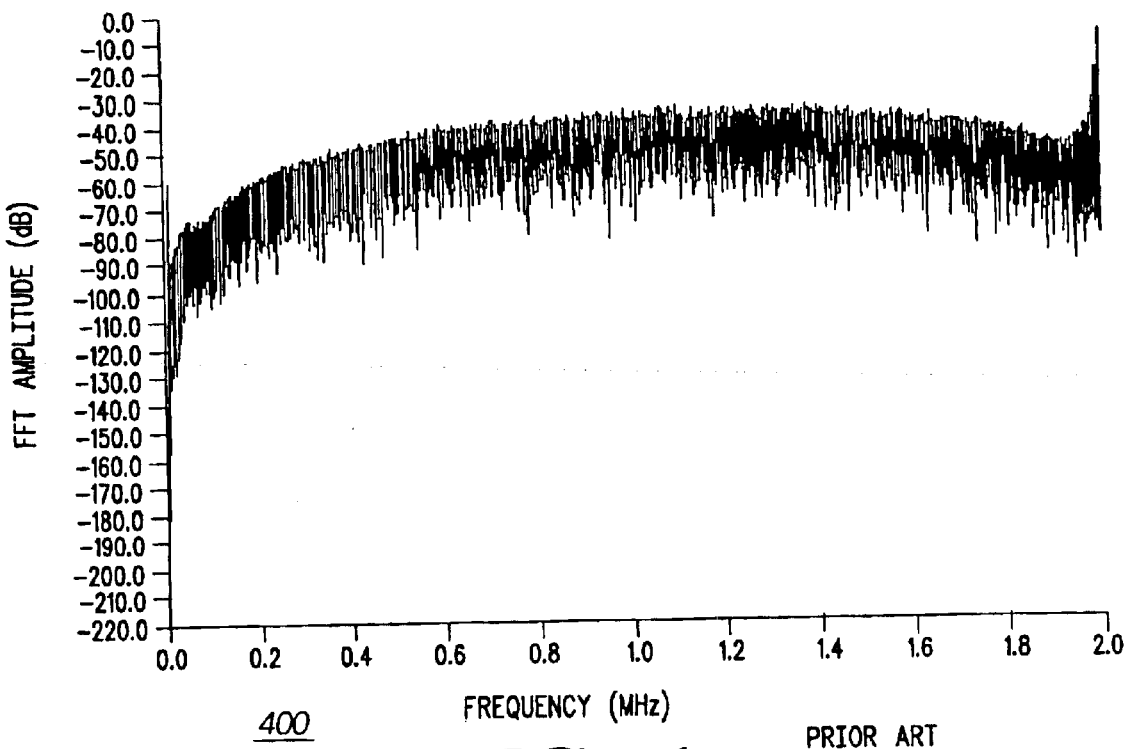
FIG. 4 is a broadband spectral diagram of the amplitude of an FFT performed on the output signal of the converter of FIG. 1 for a 10 kHz, relatively small amplitude input signal.
Figure 17:
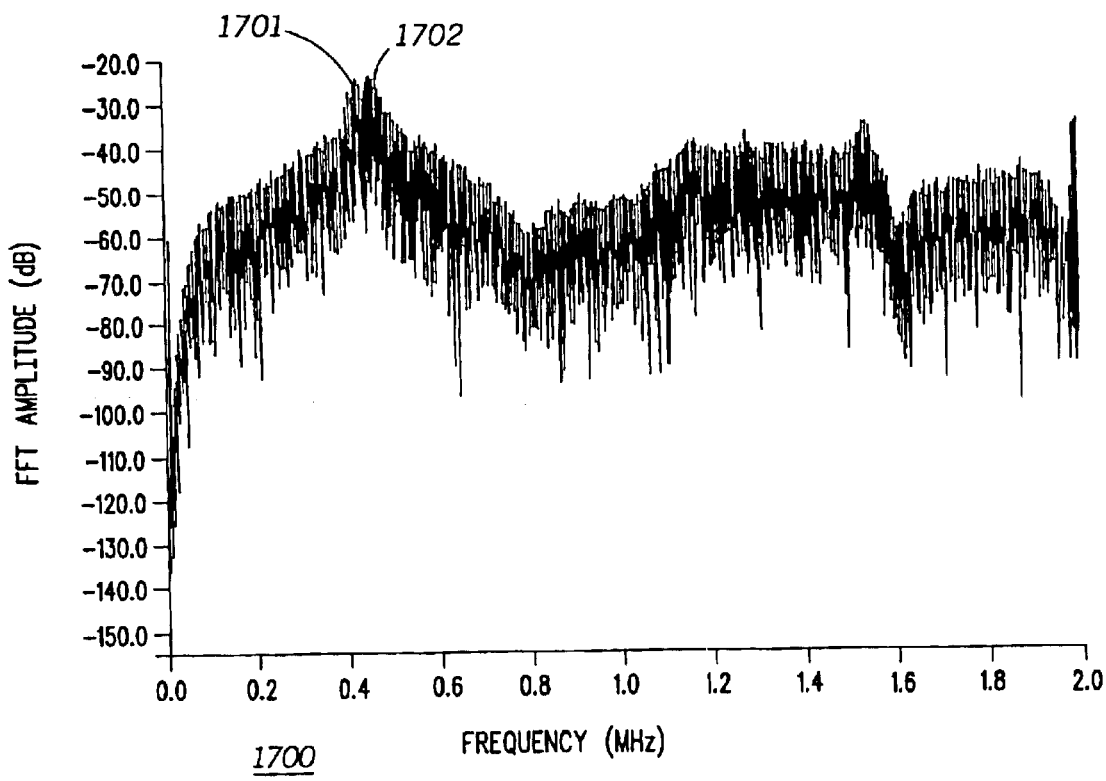
FIG. 17 is a broadband spectral diagram of the amplitude of an FFT performed on the output signal of the converter of FIG. 9 for a 10 kHz, relatively large amplitude input signal illustrating the continued presence of the out-of-band instabilities generated by the preferred instability generator of FIG. 14.
Figure 18:
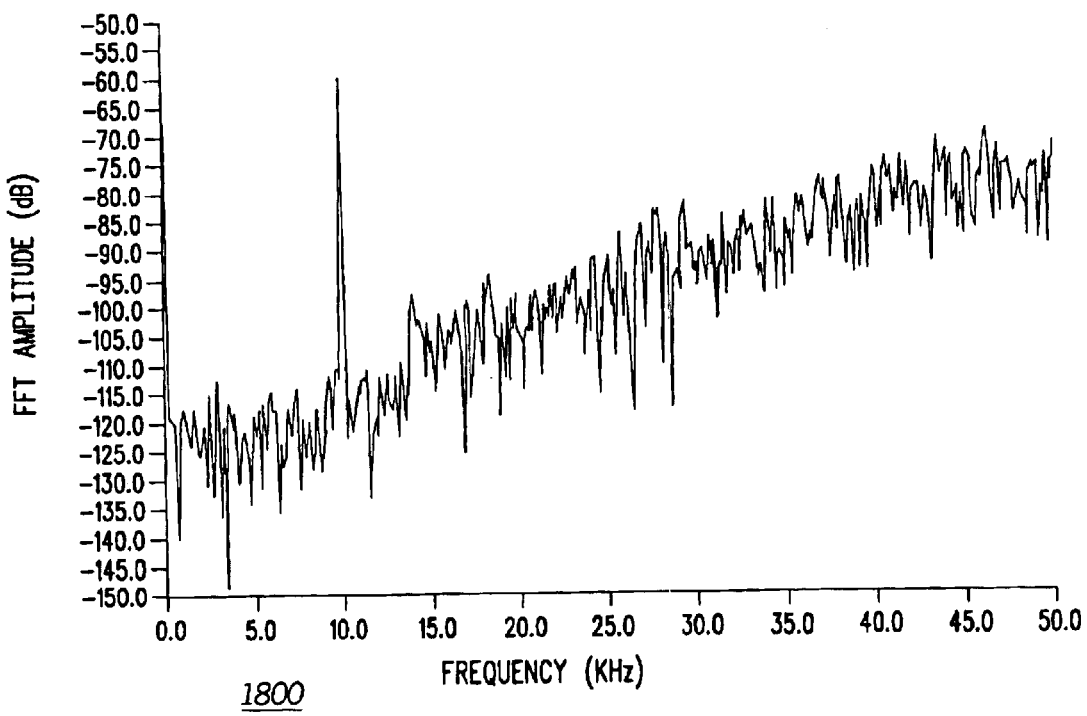
FIG. 18 is a narrowband spectral diagram of the amplitude of an FFT performed on the output signal of the converter of FIG. 9, under the same input conditions as for FIG. 17, depicting the maintained reduction of in-band idle tone and noise amplitude due to the presence of the out-of-band instabilities generated by the preferred instability generator of FIG. 14.

FIGS. 17 and 18 illustrate the stable performance of the converter 900 in the presence of large-amplitude input signals 915 when the converter 900 includes the preferred instability generator 911 of FIG. 14. FIGS. 17 and 18 are broadband and narrowband spectral diagrams 1700, 1800, respectively, of the amplitude of an FFT performed on the output signal 933 of the converter 900 for a 10 kHz input signal under the same input conditions as for FIGS. 2 and 3 (i.e., input signal level is one-half full scale). As shown in FIG. 17, the out-of-band instabilities 1701, 1702 at about 375 kHz and 425 kHz present under small signal conditions (as shown in FIG. 15) remain under large signal conditions. However, no additional instabilities are noticeable. As further shown in the narrowband diagram 1800 of FIG. 18, the idle tones remain below the thermal noise floor of the converter 900 and no additional instabilities or extraneous in-band tones are noticeable.

Although an increase in delay introduced by the instability generator 911 from one dock cycle to one and one-half or two clock cycles provides a substantial improvement in idle tone level reduction, the amount of delay that can be introduced by the instability generator 911 to create out-of-band instabilities is limited. The addition of too much delay by the instability generator 911 can create sufficient feedback loop instability to cause the converter 900 to function improperly in response to large-scale input signals 915 (i.e., input signal levels near full scale). Accordingly, for a particular sigma-delta converter architecture, an optimal amount of delay to be introduced by the instability generator 911 may be determined empirically or through the use of conventional computer simulation software.

Figure 19:
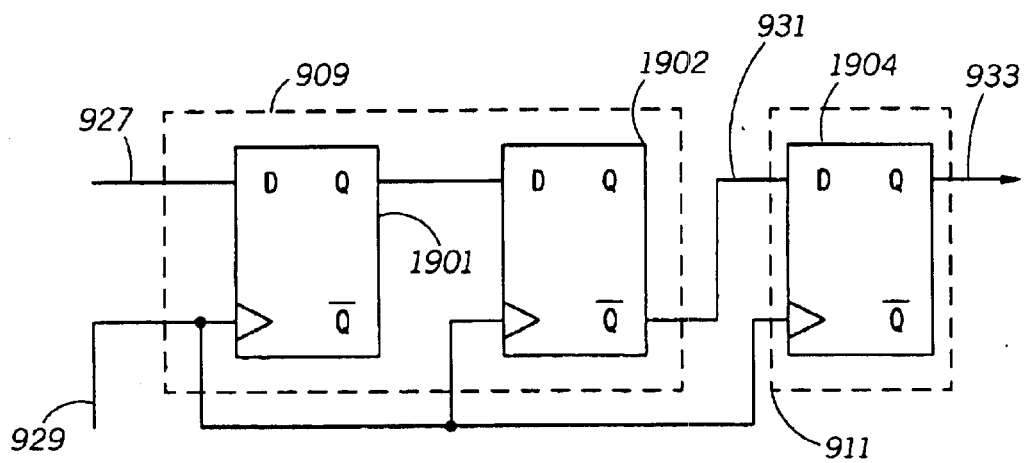
FIG. 19 is an electrical block diagram of embodiments of the storage device and the instability generator forming part of the sigma-delta converter of FIG. 9 to produce a bandpass response through the sigma-delta converter in accordance with the present invention.

FIG. 19 is an electrical block diagram of embodiments of the storage device 909 and the instability generator 911 forming part of the sigma-delta converter 900 of FIG. 9 to produce a bandpass response through the sigma-delta converter 900 in accordance with the present invention. To achieve a bandpass response, a lowpass-to-bandpass transformation of the lowpass circuit components must be undertaken. Such a transformation is well-known in the art.

With respect to a D flip-flop 1401 (as shown in FIG. 14) used to implement the storage device 909 in the lowpass embodiment of the converter 900, the lowpass-to-bandpass transformation requires a D flip-flop 1401 (as shown in FIG. 14) having its output at the non-inverting Q terminal in the lowpass design to transform into two serially connected D flip-flops 1901, 1902, wherein the first D flip-flop 1901 has its output at the non-inverting Q terminal and the second D flip-flop 1902 has its output at the inverting Q terminal. During a first clock cycle, the first D flip-flop 1901 produces an intermediate output signal from its non-inverting Q terminal, which is then stored by the second D flip-flop 1902 until the next clock cycle. During the next clock cycle, the second flip-flop 1902 produces the clocked output signal 931 from the flip-flop's inverting Q terminal. Thus, the output of the inverting Q terminal of the second D flip-flop 1902 comprises the clocked output signal 931 of the storage device 909 for the newly formed bandpass sigma-delta converter. To achieve improved signal-to-noise performance in a bandpass sigma-delta converter in accordance with the present invention, at least one instability generator 911 must be added in the feedback loop as in the lowpass sigma-delta converter 900. Thus, as shown in FIG. 19, when the storage device 909 itself comprises two D flip-flops 1901, 1902 and the instability generator 911 is implemented by a D flip-flop 1904, the D flip-flop 1904 implementing the instability generator 911 is in addition to any D flip-flops 1901, 1902 that are used to implement the storage device 909. As noted above, other converter components, such as the filters 904, 905, must also be transformed in accordance with know techniques to implement a bandpass sigma-delta converter. A bandpass sigma-delta converter with preferred implementations of the filters 904, 905 is described in detail in U.S. Pat. No. 5,768,315, which is incorporated herein by reference as if fully set forth herein.

Figure 20:
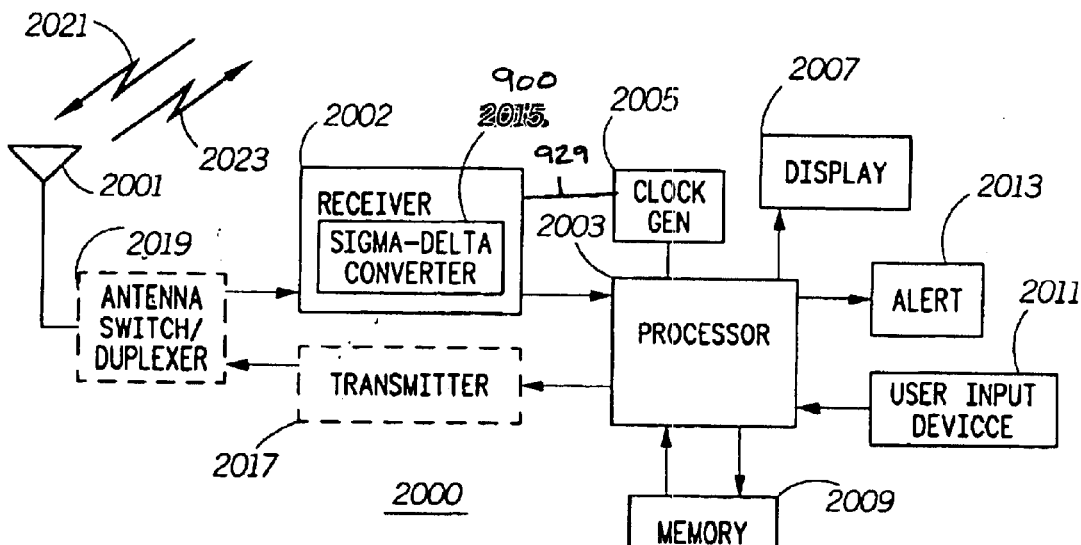
FIG. 20 is a block diagram of an exemplary communication device that includes the sigma-delta converter of FIG. 9 in accordance with the present invention.

FIG. 20 is a block diagram of an exemplary communication device 2000 that includes the sigma-delta converter 900 of FIG. 9 in accordance with the present invention. The communication device 2000 includes an antenna system 2001, a receiver 2002, a processor 2003, a clock generator 2005, a display 2007 or other user interface (e.g., a speaker), memory 2009, a user input device 2011, and an alerting device 2013. When capable of two-way operation, the communication device 2000 further includes a transmitter 2017 and may also include an antenna switch 2019 or a duplexer 2019 in the event half-duplex or full-duplex operation, respectively, is desired. The communication device 2000 may comprise a two-way mobile or portable radio, a radiotelephone, a one-way or two-way pager, a wireless data terminal (such as a palmtop computer, a personal digital assistant (PDA), or a laptop computer that includes a PCMCIA card for wireless communication), or a base transceiver site.

The receiver 2002 receives a radio signal 2021 bearing information from the antenna system 2001, via the duplexer/antenna switch 2019 when so utilized, and down-converts and demodulates the received signal 2021 to provide the information to the processor 2003. The receiver 2002 includes well-known components, such as filters, mixers, small-signal amplifiers, a demodulator, and other known elements necessary to receive, down-convert, and demodulate signals in accordance with a communication protocol utilized in the system in which the communication device 2000 is operating. As depicted in FIG. 20, the receiver 2002 also includes a sigma-delta converter 900 in accordance with the present invention. Accordingly, the receiver 2002 receives a clock signal 929 from the clock generator 2005 to operate, inter alia, the sigma-delta converter 900. The clock generator 2005 may be the communication device's master clock generator or it may generate the clock signal 929 utilized by the sigma-delta converter 900 based on a master clock signal produced by the processor 2003.

The transmitter 2017, when used, modulates and upconverts encoded information received from the processor 2003 to produce a radio frequency or microwave transmission signal 2023 bearing information to be conveyed from the antenna system 2001. The transmitter 2017 includes well-known components, such as filters, mixers, a modulator, large-signal amplifiers, and other known elements.

The processor 2003 comprises one or more microprocessors and/or one or more digital signal processors to decode and process information received from the receiver 2002 and, when the communication device 2000 is a two-way device, encode and process user information received from the user input device 2011. The memory 2009 is coupled to the processor 2003 and preferably comprises a read-only memory (ROM), a random-access memory (RAM), a programmable ROM (PROM), and/or an electrically erasable read-only memory (EEPROM). The memory 2009 preferably includes multiple memory locations for storing, inter alia, the computer programs executed by the processor 2003 to encode, decode, and otherwise process information, the address or addresses assigned to the communication device 2000, and information received for later retrieval by a user of the communication device 2000. The computer programs are preferably stored in ROM or PROM and direct the processor 2003 in controlling the operation of the communication device 2000. The address or addresses of the communication device 2000 are preferably stored in EEPROM. The information received for later retrieval is preferably stored in RAM.

The processor 2003 is preferably programmed to alert the user of the communication device 2000 of the device's receipt and storage of information by way of the alerting device 2013, such as a conventional vibration or audible alerting mechanism. Once the user has been alerted, the user can invoke functions accessible through the user input device 2011 to perceive the stored information and respond to it as necessary. The user input device 2011 preferably comprises one or more of various known input devices, such as a keypad, a computer mouse, a touchpad, a touchscreen, a trackball, and a keyboard.

Either responsive to signaling from the user input device 2011 or automatically upon receipt of certain information from the receiver 2002, the processor 2003 directs the stored information or received information, as applicable, to the display 2007. The display 2007 presents the selected a information to the user by way of a conventional liquid crystal display (LCD) or other visual display, or alternatively by way of a conventional audible device (e.g., speaker) for playing out audible messages. In addition, the processor 2003 may instruct the display 2007 to automatically present the user of the communication device 2000 with at least a visual indication (e.g., an icon or an icon in combination with a periodic chime) that informs the user that newly received information is stored in the memory 2009.

The primary novelty of the communication device 2000 lies in its use of the sigma-delta converter 900 of FIG. 9 in the receiver 2002 (e.g., as an A/D converter), the transmitter 2017 (e.g., as a D/A converter), or both. With respect to use of the sigma-delta converter 900 as an A/D converter in the receiver 2002, the converter 900 provides its output signal 933 at appropriate clock times for sampling by the processor 2003. The processor 2003 then produces a digital average of the received radio signal 2021 based on the sampled output signal 933 of the sigma-delta converter 900. The digital average of the received signal 2021 is then processed by the processor 2003 to extract imbedded information for use by the processor 2003 and the user of the communication device 2000.

Although depicted in FIG. 20 as being independent of the processor 2003, the sigma-delta converter 900 may alternatively be included as an integral element of the processor 2003. Further, the sigma-delta converter 900 may alternatively comprise an application specific integrated circuit (ASIC) that is coupled as necessary to the receiver 2002, the transmitter 2017, and/or the processor 2003.

The present invention encompasses a self-dithering sigma-delta converter and a communication device incorporating such a converter. With this invention, external dither signals need no longer be applied to sigma-delta converters to reduce in-band idle tone levels and thereby improve signal-to-noise performance for low-level input signals. Rather, in accordance with the present invention, an appropriately-configured instability generator positioned in the sigma-delta converter's feedback loop performs a self-dithering function, reducing in-band idle tone energy by correlating such energy at one or more out-of-band frequencies. The reduction of idle tone energy through the use of an instability generator instead of an external dither signal improves the sigma-delta converter's signal-to-noise performance for low-level input signals without introducing spurious RF signals that often result from a mixing of the external dither signal with frequencies of radio channels operating near the radio channel frequency of the communication device that includes the converter.

While the foregoing constitute certain preferred and alternative embodiments of the present invention, it is to be understood that the invention is not limited thereto and that in light of the present disclosure, various other embodiments will be apparent to persons skilled in the art. Accordingly, it is to be recognized that changes can be made without departing from the scope of the invention as particularly pointed out and distinctly claimed in the appended claims which shall be construed to encompass all legal equivalents thereof.

What is claimed is:

1. A sigma-delta converter that includes a feedback loop and operates over a predetermined bandwidth, the sigma-delta converter comprising:
   a forward path including:
      a summer for generating a first signal;
      a filter for averaging the first signal to produce a second signal;
      a comparator for comparing the second signal to a reference level and producing a third signal based on the comparison; and
      a storage device, coupled to an output of the comparator, for storing the third signal for a delay period and outputting the third signal responsive to a clock signal, the storage device comprising a D flip-flop that outputs the third signal responsive to the clock signal;
   a feedback path providing a representation of the third signal to a negative input of the summer, wherein the summer generates the first signal by subtracting the representation of the third signal from an input signal applied to a positive input of the summer; and
   at least one instability generator, positioned in the forward path, for generating an instability in the feedback loop at a frequency outside the predetermined bandwidth to substantially improve signal-to-noise performance of the sigma-delta converter within the predetermined bandwidth for amplitudes of the input signal that are substantially near a low end of a dynamic range of the sigma-delta converter, the at least one instability generator including a D flip-flop coupled to an output of the storage device to produce a time-delayed representation of the third signal responsive to the clock signal.

2. The sigma-delta converter of claim 1, wherein sigma-delta converter provides a bandpass frequency response and wherein the storage device comprises:
   a first D flip-flop coupled to an output of the comparator and producing an intermediate signal at a non-inverting output responsive to the clock signal; and
   a second D flip-flop coupled to the non-inverting output of the first D flip-flop and outputting the third signal at an inverting output responsive to the clock signal.

3. The sigma-delta converter of claim 2, wherein the at least one instability generator comprises at least a third D flip-flop positioned in the forward path and coupled to the inverting output of the second D flip-flop to produce a time-delayed representation of the third signal responsive to the clock signal.

4. The sigma-delta converter of claim 1, wherein the at least one instability generator comprises a capacitor.

5. A sigma-delta converter that includes a feedback loop and operates over a predetermined bandwidth, the sigma-delta converter comprising:

a forward path including:
a summer for generating a first signal;
a filter for averaging the first signal to produce a second signal; and
a comparator for comparing the second signal to a reference level and producing a third signal based on the comparison;
a feedback path providing a representation of the third signal to a negative input of the summer, wherein the summer generates the first signal by subtracting the representation of the third signal from an input signal applied to a positive input of the summer; and
at least one instability generator, positioned in at least one of the forward path and the feedback path, for generating an instability in the feedback loop at a frequency outside the predetermined bandwidth to substantially improve signal-to-noise performance of the sigma-delta converter within the predetermined bandwidth for amplitudes of the input signal that are substantially near a low end of a dynamic range of the sigma-delta converter,
wherein the at least one instability generator comprises:
a first D flip-flop responsive to a first edge of a clock signal; and
a second D flip-flop coupled to an output of the first D flip-flop and responsive to a second edge of the clock signal.

6. A sigma-delta converter that includes a feedback loop and operates over a predetermined bandwidth, the sigma-delta converter comprising:
a forward path including:
a summer for generating a first signal;
a second summer for receiving a signal for conversion from a signal source and producing an intermediate signal;
a filter for averaging the first signal to produce a second signal;
a second filter, coupled between the summer and the second summer, for averaging the intermediate signal to produce the input signal; and
a comparator for comparing the second signal to a reference level and producing a third signal based on the comparison;
a feedback path providing a representation of the third signal to a negative input of the summer, wherein the summer generates the first signal by subtracting the representation of the third signal from an input signal applied to a positive input of the summer;
a second feedback path providing the representation of the third signal to a negative input of the second summer, wherein the second summer produces the intermediate signal by subtracting the representation of the third signal from the signal for conversion; and
at least one instability generator, positioned in at least one of the forward path and the feedback path, for generating an instability in the feedback loop at a frequency outside the predetermined bandwidth to substantially improve signal-to-noise performance of the sigma-delta converter within the predetermined bandwidth for amplitudes of the input signal that are substantially near a low end of a dynamic range of the sigma-delta converter,
wherein an instability generator of the at least one instability generator is positioned in the second feedback path.

7. An improved sigma-delta converter of the type having at least one feedback loop and operating over a predetermined bandwidth, the at least one feedback loop including a forward path and a feedback path, wherein the improvement comprises:
at least one instability generator, positioned in at least one of the forward path and the feedback path, for generating an instability in the at least one feedback loop at a frequency outside the predetermined bandwidth to substantially improve signal-to-noise performance of the sigma-delta converter within the predetermined bandwidth for amplitudes of an input signal that are substantially near a low end of a dynamic range of the sigma-delta converter, the at least one instability generator including a first D flip-flop responsive to a first edge of a clock signal, and a second D flip-flop coupled to an output of the first D flip-flop and responsive to a second edge of the clock signal.

8. A communication device comprising:
(a) an antenna for receiving a radio signal bearing information;
(b) a receiver, coupled to the antenna, for down-converting and demodulating the radio signal, the receiver including a sigma-delta converter that includes a feedback loop and operates over a predetermined bandwidth, the sigma-delta converter comprising:
a forward path including:
a summer for generating a first signal;
a filter for averaging the first signal to produce a second signal;
a comparator for comparing the second signal to a reference level and producing a third signal based on the comparison; and
a storage device for storing the third signal for a delay period and outputting the third signal responsive to a clock signal to produce a clocked output signal, wherein the storage device comprises a D flip-flop that produces the clocked output signal responsive to the clock signal;
a feedback path providing a representation of the clocked output signal to a negative input of the summer, wherein the summer generates the first signal by subtracting the representation of the clocked output signal from a representation of the radio signal applied to a positive input of the summer; and
at least one instability generator, positioned in at least one of the forward path and the feedback path, for generating an instability in the feedback loop at a frequency outside the predetermined bandwidth to substantially improve signal-to-noise performance of the sigma-delta converter within the predetermined bandwidth for amplitudes of the input signal that are substantially near a low end of a dynamic range of the sigma-delta converter, and wherein the at least one instability generator comprises at least one D flip-flop positioned in the forward path of the feedback loop and coupled to an output of the storage device to produce a time-delayed representation of the clocked output signal responsive to the clock signal;
(c) a clock generator, coupled to the receiver, for generating the clock signal; and
(d) a processor, coupled to the receiver, for decoding and processing the information.

9. The communication device of claim 8, further comprising:
a user input device, coupled to the processor, for receiving user information, wherein the processor encodes the user information; and a transmitter, coupled to the processor and the antenna, for modulating and upconverting the user information into a transmission signal for transmission from the antenna.

10. A communication device comprising:

(a) an antenna for receiving a radio signal bearing information;

(b) a receiver, coupled to the antenna, for downconverting and demodulating the radio signal, the receiver including a sigma-delta converter that includes a feedback loop and operates over a predetermined bandwidth, the sign-delta converter comprising:
   a forward path including:
      a summer for generating a first signal;
      a filter for averaging the first signal to produce a second signal;
      a comparator for comparing the second signal to a reference level and producing a third signal based on the comparison; and
      a storage device for storing the third signal for a delay period and outputting the third signal responsive to a clock signal to produce a clocked output signal;
   a feedback path providing a representation of the clocked output signal to a negative input of the summer, wherein the summer generates the first signal by subtracting the representation of the clocked output signal from a representation of the radio signal applied to a positive input of the summer; and
   at least one instability generator, positioned in at least one of the forward path and the feedback path, for generating an instability in the feedback loop at a frequency outside the predetermined bandwidth to substantially improve signal-to-noise performance of the sigma-delta converter within the predetermined bandwidth for amplitudes of the input signal that are substantially near a low end of a dynamic range of the sigma-delta converter;
   wherein the at least one instability generator comprises:
      a first D flip-flop responsive to a first edge of the clock signal; and
      a second D flip-flop coupled to an output of the first D flip-flop and responsive to a second edge of the clock signal, (c) a clock generator, coupled to the receiver, for generating the clock signal; and (d) a processor, coupled to the receiver, for decoding and processing the information.

11. A communication device comprising:

(a) an antenna for receiving a radio signal bearing information;

(b) a receiver, coupled to the antenna, for downconverting and demodulating the radio signal, the receiver including a sigma-delta converter that includes a feedback loop, operates over a predetermined bandwidth, and provides a bandpass frequency response, the sigma-delta converter comprising:
   a forward path including:
      a summer for generating a first signal;
      a filter for averaging the first signal to produce a second signal;
      a comparator for comparing the second signal to a reference level and producing a third signal based on the comparison; and
      a storage device for storing the third signal for a delay period and outputting the third signal responsive to a clock signal to produce a clocked output signal, wherein the storage device comprises:
         a first D flip-flop coupled to an output of the comparator and producing an intermediate signal at a non-inverting output responsive to the clock signal; and
         a second D flip-flop coupled to the non-inverting output of the first D flip-flop and producing the clocked output signal at an inverting output responsive to the clock signal;
   a feedback path providing a representation of the clocked output signal to a negative input of the summer, wherein the summer generates the first signal by subtracting the representation of the clocked output signal from a representation of the radio signal applied to a positive input of the summer; and
   at least one instability generator, positioned in at least one of the forward path and the feedback path, for generating an instability in the feedback loop at a frequency outside the predetermined bandwidth to substantially improve signal-to-noise performance of the sigma-delta converter within the predetermined bandwidth for amplitudes of the input signal that are substantially near a low end of a dynamic range of the sigma-delta converter;
   wherein the at least one instability generator comprises at least a third D flip-flop positioned in the forward path of the feedback loop and coupled to the inverting output of the second D flip-flop to produce a time-delayed representation of the clocked output signal responsive to the clock signal;

(c) a clock generator, coupled to the receiver, for generating the clock signal; and (d) a processor, coupled to the receiver, for decoding and processing the information.

\* \* \* \* \*